United States Patent
Rimshaw et al.

(10) Patent No.: US 11,193,825 B2
(45) Date of Patent: Dec. 7, 2021

(54) SHORT PULSEWIDTH HIGH REPETITION RATE NANOSECOND TRANSIENT ABSORPTION SPECTROMETER

(71) Applicant: The Penn State Research Foundation, University Park, PA (US)

(72) Inventors: Adam Rimshaw, Fairfield, PA (US); Christopher Grieco, Yonkers, NY (US); Eric Kennehan, Berlin Center, OH (US); John B. Asbury, State College, PA (US)

(73) Assignee: The Penn State Research Foundation, University Park, PA (US)

( * ) Notice: Subject to any disclaimer, the term of this patent is extended or adjusted under 35 U.S.C. 154(b) by 179 days.

(21) Appl. No.: 16/613,717

(22) PCT Filed: May 24, 2018

(86) PCT No.: PCT/US2018/034351
§ 371 (c)(1),
(2) Date: Nov. 14, 2019

(87) PCT Pub. No.: WO2018/217997
PCT Pub. Date: Nov. 29, 2018

(65) Prior Publication Data
US 2021/0172799 A1 Jun. 10, 2021

Related U.S. Application Data

(60) Provisional application No. 62/656,184, filed on Apr. 11, 2018, provisional application No. 62/510,377, filed on May 24, 2017.

(51) Int. Cl.
*G01J 3/42* (2006.01)
*G01J 3/02* (2006.01)
(Continued)

(52) U.S. Cl.
CPC ............... *G01J 3/42* (2013.01); *G01J 3/0297* (2013.01); *G01J 3/18* (2013.01); *G01N 21/31* (2013.01);
(Continued)

(58) Field of Classification Search
CPC .... G01J 3/42; G01J 3/0297; G01J 3/18; G01J 3/2889; G01N 21/31; G01N 2021/3125; G01R 13/02
See application file for complete search history.

(56) References Cited

U.S. PATENT DOCUMENTS

| 3,551,053 A | 12/1970 | Windsor et al. |
| 4,980,566 A | 12/1990 | Heilweil |

(Continued)

FOREIGN PATENT DOCUMENTS

| CN | 103018214 A | 4/2013 |
| WO | 03010519 A1 | 2/2003 |

OTHER PUBLICATIONS

International Search Report dated Aug. 8, 2018, International Application No. PCT/US2018/034351.
(Continued)

*Primary Examiner* — Mohamed K Amara
(74) *Attorney, Agent, or Firm* — Dinsmore & Shohl LLP

(57) ABSTRACT

A high-sensitivity nanosecond to millisecond transient absorption spectrometer for measurements of miniscule signals under low excitation intensities includes an excitation source generating a >100 Hz, <5 ns pulsewidth excitation pulse for exciting a light absorbing sample, a probe light source for generating a high photon flux probe light beam producing an average irradiance greater than 1 $\mu W\ m^{-2}\ nm^{-1}$ for measuring the transient absorption spectrum of the sample before and after excitation by the excitation source, a DC-coupled detector capable of measuring light for
(Continued)

enabling synchronous measurement of both the transmission of the probe light beam and the change in transmission of the probe light beam between a signal with the excitation pulse present and a signal in the absence of the excitation pulse, and a digital oscilloscope with a trigger rearm time capable of collecting every trigger event at frequencies including 1MHz, for enabling sequential noise subtraction protocols.

15 Claims, 10 Drawing Sheets

(51) Int. Cl.
  *G01J 3/18* (2006.01)
  *G01N 21/31* (2006.01)
  *G01R 13/02* (2006.01)
(52) U.S. Cl.
  CPC ..... *G01R 13/02* (2013.01); *G01N 2021/3125* (2013.01)

(56) References Cited

U.S. PATENT DOCUMENTS

| | | | |
|---|---|---|---|
| 5,737,077 A | 4/1998 | Lee et al. | |
| 6,020,962 A | 2/2000 | Curbelo | |
| 6,025,597 A | 2/2000 | Sterling et al. | |
| 6,163,378 A * | 12/2000 | Khoury | G01J 3/0259 356/457 |
| 6,191,861 B1 | 2/2001 | McBranch et al. | |
| 6,825,921 B1 * | 11/2004 | Modlin | G01N 21/255 235/454 |
| 7,852,472 B1 | 12/2010 | Johnson | |
| 8,072,595 B1 * | 12/2011 | Bastiaans | G01N 21/65 356/301 |
| 8,368,034 B2 * | 2/2013 | Poteet | G01J 3/0264 250/461.1 |
| 10,180,397 B2 * | 1/2019 | Rakic | G01N 21/3581 |
| 2002/0067480 A1 | 6/2002 | Takahashi | |
| 2008/0117418 A1 * | 5/2008 | Claps | G01N 21/6408 356/318 |
| 2009/0283680 A1 * | 11/2009 | Logan, Jr. | G01J 3/10 250/339.07 |
| 2010/0294934 A1 * | 11/2010 | Hashimoto | G01N 21/3581 250/338.1 |
| 2010/0309464 A1 * | 12/2010 | Treado | G01J 3/027 356/301 |
| 2011/0122407 A1 | 5/2011 | Jalali et al. | |
| 2013/0258343 A1 | 10/2013 | Zhu et al. | |
| 2013/0321801 A1 | 12/2013 | Levis et al. | |
| 2014/0268131 A1 | 9/2014 | Tamada | |
| 2017/0074794 A1 | 3/2017 | Nakagawa et al. | |

OTHER PUBLICATIONS

T.J. Johnson, et al., Applications of Time-Resolved Step-Scan and Rapid-Scan FT-IR Spectroscopy: Dynamics from Ten Seconds to Ten Nanoseconds; 6 pages.

Kwang S. Jeong et al., Vibrational Spectroscopy of Electronic Processes in Emerging Photovoltaic Materials, 10 pages.

Ryan D. Pensack et al., Charge Trapping in Organic Photovoltaic Materials Examined with Time-Resolved Vibrational Spectroscopy, 7 pages.

A. Rimshaw et al., Using fast digitizer acquisition and flexible resolution to enhance noise cancellation for high performance nanosecond transient absorbance spectroscopy, 4 pages.

Sameer Vajjala Kesava, et al., Domain Compositions and Fullerene Aggregation Govern Charge Photogeneration in Polymer/Fullerene Solar Cells; 10 pages.

Ryan D. Pensack et al., Beyond the Adiabatic limit: Charge Photogeneration in Organic Photovoltaic Materials; 9 pages.

Rimshaw, Adam et al., "High Sensitivity Nanosecond Mid-Infrared Transient Absorption Spectrometer Enabling Low Excitation Density Measurements of Electronic Materials", vol. 70, No. 10, Jul. 20, 2016 (Jul. 20, 2016), pp. 1726-1732.

* cited by examiner

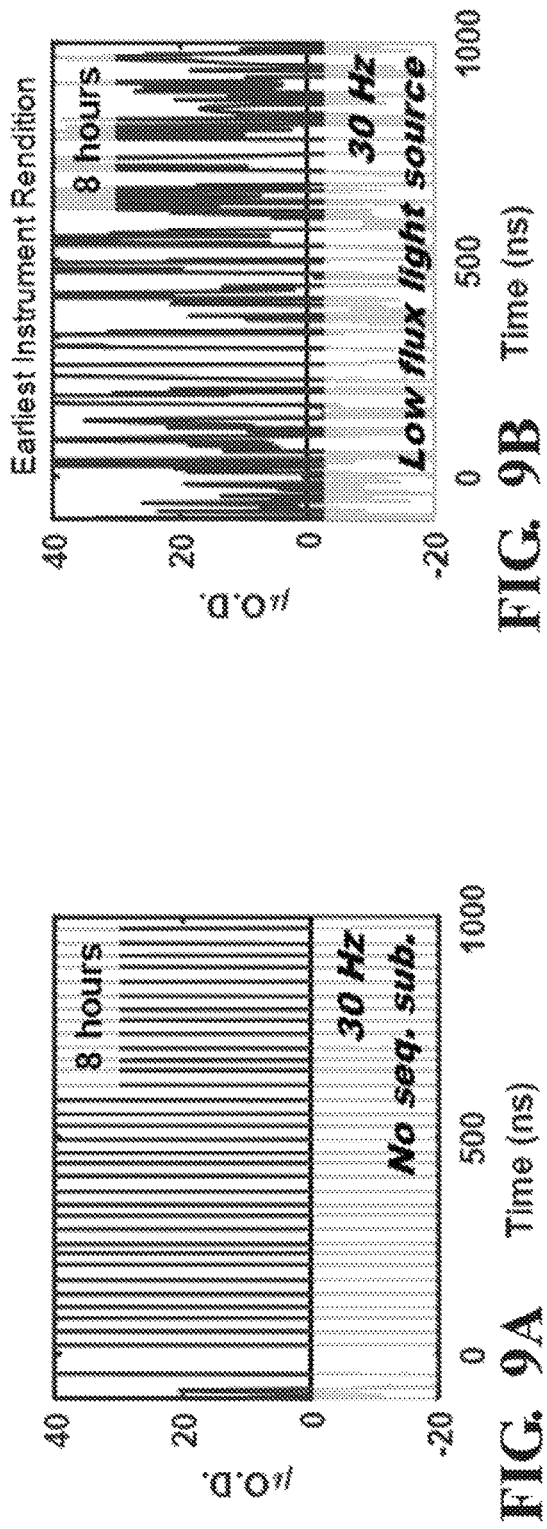
FIG. 9A
FIG. 9B
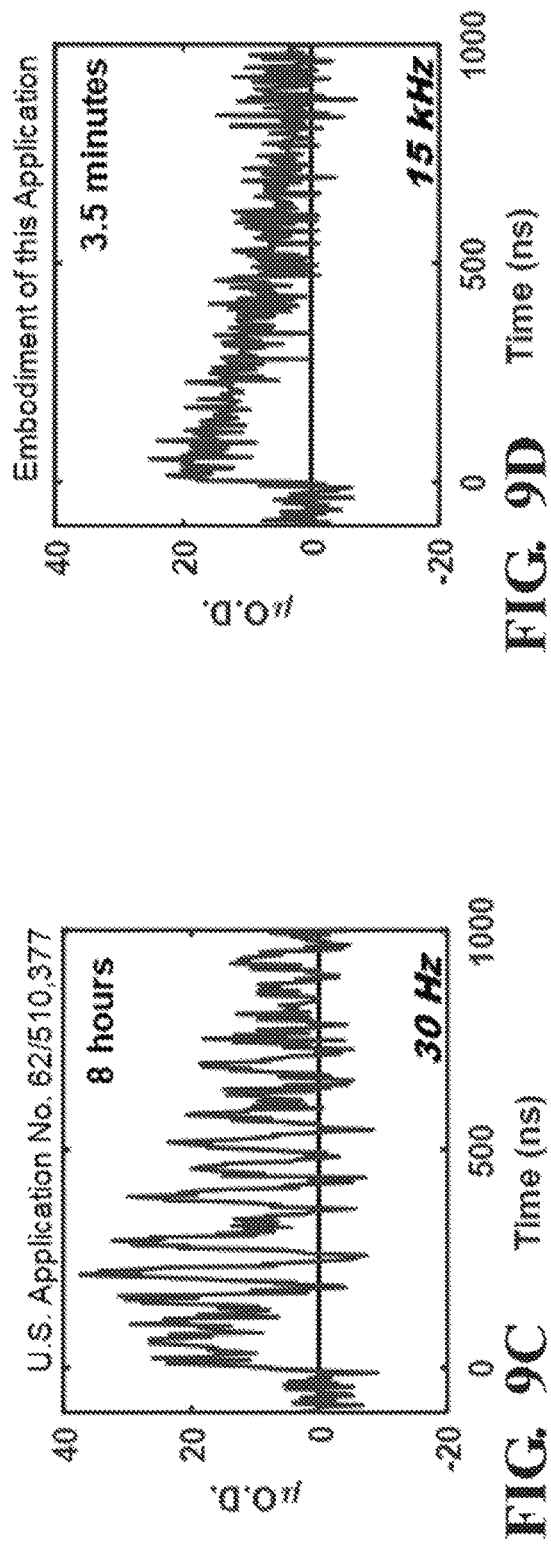
FIG. 9C
FIG. 9D

SHORT PULSEWIDTH HIGH REPETITION RATE NANOSECOND TRANSIENT ABSORPTION SPECTROMETER

REFERENCE TO RELATED APPLICATION

This application is the U.S. national stage of PCT/US2018/034351 filed May 24, 2018, which claims priority to U.S. Provisional Patent Application Ser. No. 62/510,377, filed May 24, 2017, and U.S. Provisional Patent Application Ser. No. 62/656,184, filed Apr. 11, 2018 the entire content of which is incorporated herein by reference.

GOVERNMENT SUPPORT

This invention was made with government support under Grant No. DE-SC0008120 awarded by the Department of Energy. The Government has certain rights in the invention.

FIELD OF THE INVENTION

The present invention relates to transient absorption spectrometers, and more particularly, relates to nanosecond mid-infrared, near-infrared, visible and ultraviolet transient absorption spectrometers.

BACKGROUND OF THE INVENTION

Nanosecond-to-millisecond time-resolved transient absorption spectroscopy is an instrumental technique that enables the measurement of dynamics occurring in a plethora of chemical, biochemical, and materials chemistry systems. Such dynamics lead to unique, significant insights into the molecular-level qualities that lead to their ultimate physical and chemical properties, which cannot be directly assessed by alternate experimental means. For example, numerous physical and chemical processes occurring on the nanosecond to millisecond timescale, such as charge trapping and recombination in solar cells, protein folding, cross-linking of polymers, and general chemical reactions, can be monitored. Alternate, routine transient absorption techniques include ultrafast pump-probe spectroscopy and time-dependent steady-state spectroscopy, which can only access physical and chemical changes occurring on femtosecond to early nanosecond or hundreds of milliseconds-and-later timescales, respectively. Thus, there exists a gap in time in which information cannot be accessed by these current, widespread technologies.

The kernel of all the limitations that scientists have faced when implementing nanosecond-to-millisecond time-resolved transient absorption spectroscopy is the miniscule signal sizes provided by measuring subpopulations within the sample. The small signal sizes arise from the requirement to investigate samples using the lowest excitation laser fluences possible in order to avoid sample degradation and to follow physical and chemical processes within a linear signal response regime. This creates the requirement of a high-sensitivity instrument, whose detection system increases the absorption S/N ratio to unprecedented levels. Because the signal size is limited by the sample and the experimental conditions (see Rimshaw et al. *Appl. Spec.* 2016. 70, 1726-1732 for details), the primary criterion for this technology is the development of noise suppression techniques.

Thus far, using available technologies, scientists have succeeded in implementing sensitive time-resolved spectroscopy using unique noise-suppression strategies in ultrafast pump-probe (femtosecond-to-early-nanosecond) and time-dependent steady-state spectroscopy (hundreds of microseconds-and-later) instrumentations. These noise suppression strategies are either not available or are severely limited to implementation in nanosecond-to-millisecond instrumentation. In particular, ultrafast pump-probe spectroscopy generally employs a gated-integrator or lock-in amplifier detection scheme that suppresses noise using electronic bandwidth limiters and boost signals by enabling isolation and integration of detected signals over specific time periods. Such detection schemes have been successfully employed in the past for nanosecond-to-millisecond time-resolved spectroscopy, however, the number of scans needed to improve S/N is severely limited because the acquisition of the signal across the entire nanosecond-to-microsecond time window ("time-sampling") takes an impractical amount of real-time. This, in turn, leads to poor detection sensitivity. In addition, ultrafast pump-probe spectroscopy further increases S/N by increasing the signal level (S) through the use of high energy lasers, capable of high peak powers. High peak power lasers employed for this type of spectroscopy are quite large, complex, and expensive and thus limit their application almost exclusively to large academic institutions throughout the world. On the other hand, time-dependent, steady-state spectroscopy has overcome the S/N problem through a variety of alternative methods. An example of such a strategy is the incorporation of a Michelson interferometer into the detection system, leading to the so-called "Fourier-transform infrared" (FT-IR) spectroscopy instrument. Superior S/N strength is achievable through the measurement of the signal in the time-domain, which takes advantage of the interference characteristics of light waves used in the experiment. This measurement requires an oscillating translation motion of one of its optical components in order to generate interference patterns needed to collect signals. Because of this, the implementation of FT-IR methods into the detection of signals with nanosecond-to-millisecond time-sampling ability, while successful, is incredibly time-consuming. Thus, the acquisition of an adequate number of scans to achieve sufficient S/N again requires impractical amounts of real-time sampling, leading to poor detection sensitivity.

A superior method for acquiring nanosecond-to-millisecond, transient absorption signals is flash photolysis spectroscopy. This method is advantageous because the detected signal is electronically time-resolved, allowing the sampling of time points across the nanosecond-to-millisecond timescale to be collected for a single laser pulse. Consequently, the acquisition time for a scan (containing all the time-samples needed) is very short by comparison to the ultrafast pump-probe and steady state techniques. However, the primary challenge for the flash photolysis method, fundamentally arising from the process of electronically time-resolving the signal, is the effective suppression of noise. Because it is electronically time-resolved, the signal cannot be integrated over time using gated integrators, electronic bandpass filters, or lock-in amplifiers, since these severely relinquish time-sampling and time-resolution. Thus, other methods for suppressing noise (not just improving S/N by increasing the number of signals averaged) are needed. To date, previous technology has achieved mediocre sensitivities of $>10^{-5}$ O.D. Because of this, the application of nanosecond-to-millisecond time-resolved mid-IR spectroscopy has been limited either to sample systems producing the highest signals, or to experiments in which extremely harsh laser-excitation conditions are employable. Limited experimental studies have merely avoided the noise suppression issues at the forefront of nanosecond-to-millisecond, transient absorption spectroscopy by increasing the signal, often times at the cost of accurate/realistic data and damage to samples.

SUMMARY OF THE INVENTION

The present invention provides a high-sensitivity nanosecond to millisecond transient absorption spectrometer for measurements of miniscule signals under low excitation intensities. The spectrometer may include an excitation source generating an excitation pulse for exciting a light absorbing sample, a probe light source generating a probe light beam for measuring the transient absorption spectrum of the sample by monitoring transmission signals of the probe light beam before and after excitation by the excitation pulses, a detector for detecting the transmission signals and a change in the transmission signals of the probe light beam, and a digital oscilloscope for collecting the detected signals.

In a preferred embodiment, at least three of the following noise cancellation techniques are true: 1. the excitation pulse has a high frequency greater than 100 Hz and a short pulsewidth less than 5 ns; 2. the probe light beam has a high photon flux with an average irradiance greater than 1 $\mu$W m$^{-2}$ nm$^{-1}$; 3. the detector is a DC-coupled detector capable of measuring light for enabling sequential switching of an AC- and DC-coupled detection scheme for synchronous measurement of both the transmission of the probe light beam in the absence of the excitation signal and the change in transmission of the probe light beam between a signal with the excitation pulse present and a signal in absence of the excitation pulse; 4. the digital oscilloscope has rapid trigger rearm time capabilities and is fast enough to collect every trigger event at high frequencies up to 1 MHz, for enabling sequential noise subtraction protocols.

In one embodiment, the three noise cancellation techniques include a probe light beam with a high photon flux producing an average irradiance greater than 1 $\mu$W m$^{-2}$ nm$^{-1}$, the detector which is a DC-coupled detector capable of measuring light for enabling sequential switching of an AC- and DC-coupled detection scheme for synchronous measurement of both the transmission of the probe light beam in the absence of excitation and the change in transmission of the probe light beam between a signal with an excitation pulse present and a signal in absence of the excitation pulse, and the digital oscilloscope having rapid trigger rearm time capabilities and fast enough to collect every trigger event at high frequencies up to and including 1 MHz, for enabling sequential noise subtraction protocols.

In another embodiment, three noise cancellation techniques include the excitation pulse with a high frequency greater than 100 Hz and a short pulsewidth less than 5 ns, the probe light beam having a high photon flux sufficient to produce an average irradiance of more than 1 $\mu$W m$^{-2}$ nm$^{-1}$, and the detector which is a DC-coupled detector capable of measuring light for enabling sequential switching of an AC- and DC-coupled detection scheme for synchronous measurement of both the transmission of the probe light beam in the absence of excitation and the change in transmission of the probe light beam between a signal with an excitation pulse present and a signal in absence of the excitation pulse.

In another embodiment, three noise cancellation techniques include the excitation pulse with a high frequency (>100 Hz) and a short pulsewidth (<5 ns), the probe light beam having a high photon flux producing an average irradiance greater than 1 $\mu$W m$^{-2}$ nm$^{-1}$, and the digital oscilloscope having rapid trigger rearm time capabilities and which is fast enough to collect every trigger event at high frequencies up to 1 MHz, for enabling sequential noise subtraction protocols.

In yet another embodiment, three noise cancellation techniques include the excitation pulse with a high frequency (>100 Hz) and a short pulsewidth (<5 ns), the detector which is a DC-coupled detector capable of measuring light for enabling sequential switching of an AC- and DC-coupled detection scheme for synchronous measurement of both the transmission of the probe light beam in the absence of excitation and the change in transmission of the probe light beam between a signal with an excitation pulse present and a signal in absence of the excitation pulse, and the digital oscilloscope having rapid trigger rearm time capabilities and which is fast enough to collect every trigger event at high frequencies up to 1 MHz, for enabling sequential noise subtraction protocols.

In one embodiment, the spectrometer includes an excitation source generating a high frequency (>100 Hz), short pulsewidth (<5 ns) excitation pulse for exciting a light absorbing sample, a probe light source for generating a high photon flux probe light beam producing an average irradiance greater than 1 $\mu$W m$^{-2}$ nm$^{-1}$ for measuring the transient absorption spectrum of the sample by monitoring transmission signals of the probe light beam before and after excitation by the excitation source, a DC-coupled detector capable of measuring light for enabling synchronous measurement of both the transmission of the probe light beam in the absence of excitation and the change in transmission of the probe light beam between a signal with an excitation pulse present and a signal in absence of the excitation pulse, and a digital oscilloscope with rapid trigger rearm time capabilities, fast enough to collect every trigger event at high frequencies up to 1 MHz, for enabling sequential noise subtraction protocols.

The excitation source may be a physical, thermal, electrical, or chemical stimulus source. The probe light beam may be in the ultraviolet, visible, near-IR, and/or mid-IR spectral region(s). The detector is capable of measuring light in the ultraviolet, visible, near-IR, and/or mid-IR spectral region(s). The high-sensitivity nanosecond transient absorption spectrometer may include an optical layout including parabolic reflectors or lenses.

Different embodiments with two noise cancellation technologies overlapping may also exist. For example, the high-sensitivity nanosecond to millisecond transient absorption spectrometer may include a high photon flux probe light source in the mid-IR spectral region producing an average irradiance greater than 1 $\mu$W m$^{-2}$ nm$^{-1}$ with a DC-coupled detector in the mid-IR, enabling synchronous measurement of both the transmission of the probe light beam in the absence of excitation and the change in transmission of the probe light beam between a signal with an excitation pulse present and a signal in absence of the excitation pulse.

In another example, the high-sensitivity nanosecond to millisecond transient absorption spectrometer may include a DC coupled detector in the mid-IR, enabling synchronous measurement of both the transmission of the probe light beam in the absence of excitation and the change in transmission of the probe light beam between a signal with an excitation pulse present and a signal in absence of the excitation pulse spectral region with a high repetition rate (>100 Hz) optical, electrical, chemical, physical or thermal excitation source.

BRIEF DESCRIPTION OF THE DRAWINGS

FIG. 9A is a plot showing sample measurements represented in FIG. 8A but plotted on the same vertical scale as the other sample measurements in the figure. In particular, a low repetition-rate excitation, no sequential subtraction noise suppression, no sequential switching between AC- and DC-coupled detection scheme with a DC-coupled detector, and high flux mid-IR light source were used;

FIG. 9B is a plot showing sample measurements represented in FIG. 8B but plotted on the same vertical scale as the other sample measurements in the figure. In particular, a low repetition-rate excitation, with sequential subtraction noise suppression, low flux mid-IR light source, and sequential switching between AC- and DC-coupled detection scheme with a DC-coupled detector was used;

FIG. 9C is a plot showing sample measurements represented in FIG. 8C but plotted on the same vertical scale as the other sample measurements in the figure. In particular, a low repetition-rate excitation, with sequential subtraction noise suppression, high flux mid-IR light source, and sequential switching between AC- and DC-coupled detection scheme with a DC-coupled detector was used;

FIG. 9D is a plot showing sample measurements represented in FIG. 8D but plotted on the same vertical scale as the other sample measurements in the figure. In particular, a high repetition-rate excitation, with sequential subtraction noise suppression, high flux mid-IR light source, and sequential switching between AC- and DC-coupled detection scheme with a DC-coupled detector was used;

DETAILED DESCRIPTION OF THE EMBODIMENTS

Overview

Figure 1:
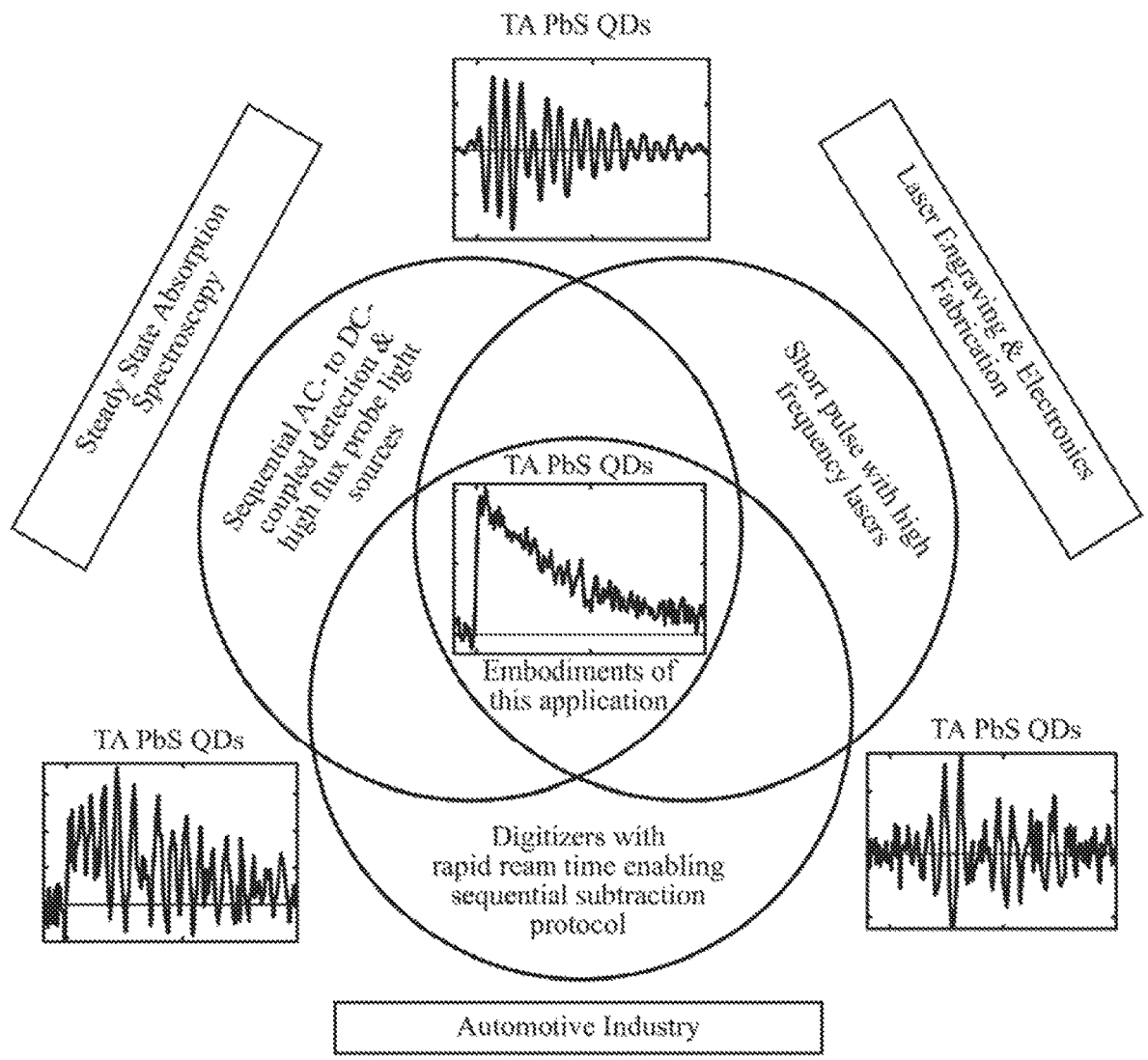
FIG. 1 is a Venn diagram of the three components of a time-resolved transient absorption spectrometer according to an embodiment of the present invention.

The present invention provides exceptional consolidation of three noise suppression strategies to generate unexpected and unparalleled S/N levels for any transient absorption spectrometer to date. A clear illustration of the three noise suppression techniques that were combined in the invention, along with representative data collected using different combinations of the techniques is shown in FIG. 1. The center plot demonstrates the significant improvement in signal-to-noise when all three technologies are merged in the correct manner. Note that all the collected data are transient absorption decays of PbS quantum dots (TA PbS QDs), and were collected under identical conditions other than eliminating the specified component from the instrument.

Contrary to prior thinking, the fusion of these three distinct noise management approaches does not result in an "additive-like" effect, in which the joining of two strategies produces some improvement and the addition of the third provides an addition boost in S/N ratio. Instead, the three independent methods complement one another to exponentially increase instrument sensitivity to unprecedented levels which surpass all competing technologies and expectations.

According to one embodiment of the present invention, the three noise cancellation protocols for which the invention relies are: 1) sequential switching between AC- and DC-coupled detection schemes using DC-coupled mid-infrared (mid-IR), mercury cadmium telluride (MCT) photodiodes in conjunction with high photon flux mid-IR light sources, 2) Short pulse width, high frequency lasers, and 3) Digital oscilloscopes with rapid trigger rearm time enabling sequential noise subtraction protocols.

According to other embodiments of the present invention, the high photon flux light sources may be in other wavelength regions, such as near-IR, UV or visible. The DC-coupled detectors for near-IR, UV or visible light may be used in conjunction with the corresponding high photon flux light sources.

According to some other embodiments of the present invention, the pump source may be any high frequency short-time trigger event such as mechanical, electrical, chemical or thermal sources, as long as the trigger events are operable as a sample modulation source.

The major adaptation made to the existing technology presented in U.S. Provisional patent Application No. 62/510,377 is the incorporation of a high repetition rate, short pulse width laser with the existing instrumentation. Using a high repetition rate laser (0.1-1000 kHz) as opposed to a low frequency Nd:YAG laser (30 Hz) allows for faster sample averaging since a greater number of laser fire events can be recorded for a given time interval. In addition to the ability to average faster using higher repetition rates, data collection at frequencies of 0.1 kHz and higher has been shown to suppress the noise floor by reducing 1/f (or pink) noise. By suppressing 1/f noise, some improvement in sensitivity is achieved, however frequency-independent white noise is always present and therefore the S/N gain from increasing frequency alone is limited. Therefore, the exceptional S/N obtained for this instrument does not independently rely on frequency for noise suppression. This is clearly demonstrated by the top middle, and bottom right, transient absorption profiles in FIG. 1, in which neither data set has a clearly resolvable signal. If repetition rate was solely responsible for the S/N suppression in this technology, then one or both of these transient absorption decays would have distinct signals.

The sequential subtraction noise cancellation procedure has been developed recently by our lab (see Rimshaw et al. Rev. Sci. Instr. 2015. 86, 066107 for details). In order for sequential subtraction to work, every laser shot must be collected; a feat which is not customary in nanosecond-to-millisecond transient absorption spectroscopy, even when operating at low frequencies. This is due to the widespread use of oscilloscopes which do not have rapid trigger rearm capabilities. Without this capability, the laser trigger events occur at a higher frequency than the oscilloscope can measure and therefore laser shots are missed. Increasing the repetition rate of the laser to thousands of shots per second only increases the demand for rapid trigger capabilities. By utilizing a digital oscilloscope adapted from the automotive industry with rapid trigger rearm capabilities, every laser shot can be collected up to ~1 MHz without missing. This ensures that the sequential subtraction method, which has been demonstrated to produce some of the highest S/N levels reported to date, can be incorporated into this technology. Although this noise cancellation protocol has been demonstrated to decrease noise levels, it, like high frequency sampling, is not individually responsible for the orders of magnitude improvement in sensitivity of this technology. The bottom left and bottom right data sets in FIG. 1 establish this point since the noise level in each case is substantially larger and only a slight signal can be imagined for the bottom left plot after eight hours of scanning. If sequential subtraction was exclusively responsible for the S/N suppression capabilities discussed in this disclosure, then one or both of these transient absorption decays would again display clear signals.

The final technique that has been used previously to effectively increase S/N levels is the use of high photon flux mid-IR light sources producing an average irradiance greater than 1 $\mu W \ m^{-2} \ nm^{-1}$ in conjunction with sequentially switching between an AC- and DC-coupled detection scheme using DC-coupled detectors. (62/510,377) Intense mid-IR light sources have been used previously to increase signal resolution, while sequential switching between AC- and DC-coupling allows for the cancellation of long term (>1 s) light fluctuations decreasing noise. Both of these components have been widely used for steady-state absorption spectroscopy and together these two devices can increase the sensitivity of transient absorption instrumentation. If the use of sequential switching between AC- and DC-coupling using DC-coupled detectors with high power output mid-IR light sources was responsible for the current technology's superb sensitivity then the top middle, and bottom right, graphs in FIG. 1 should have well-defined signals present. This is not the case however, and this strategy alone is not responsible for the recent advances.

From investigation of the outer data sets in FIG. 1, it is clear that no single noise suppression strategy can be responsible for the unprecedented S/N enhancements achieved for this technology. In fact, there is not a combination of even any two of these noise cancellation techniques that have sensitivities even remotely close to the current technology (center data). It is only when all three procedures are harmoniously combined in the precise manner that the S/N levels are increased by more than a factor of one hundred compared to the most sensitive electronically time-resolved transient absorption instrument reported to date.

The pronounced jump in sensitivity is a direct result of the synergistic combination of three separate noise suppression strategies developed independently, which have never before been simultaneously combined in a single electronically time-resolved transient absorption instrument. It is the unique consolidation of these strategies which allows each of the methods to complement one another in a cooperative manner to provide unparalleled and unexpected leaps in sensitivity. The removal of any single noise suppression strategy from the instrument results in orders of magnitude reduction of S/N in the instrument.

TECHNICAL DESCRIPTION OF THE TECHNOLOGY

1. Instrument Design

A summary of the specific optical components and design of an exemplary embodiment will be presented in this section. The instrument layout is diagrammed in FIG. 2 including the following components: 1. cylindrical lens; 2. plane mirror; 3. sample/cryostat; 4. globar housing (mounted on 2-D stage); 5. 1" diameter. 4" focal length, gold parabolic reflector; 6. 1" diameter, 2" focal length gold parabolic reflector; 7. removable 1" diameter, 4" focal length, gold parabolic reflector on a kinematic base; 8. monochromator; 9. 16 MHz MCT detector; 10. 100 MHz MCT detector; 11. wall; 12. iris; 13. IR optical filters; 14. long pass IR filter; 15.

shutter; 16. Stepper motor; 17. filter wheel; 18. kinematic base; 19. 1-100 kHz Nd:YAG laser; 20. optical chopper.

The instrument consists of two optical beam paths. The first is the laser excitation source, which is a 2.5 ns, 1-100 kHz Nd:YAG laser 19. It must be noted that the instrument is designed to employ this laser by default; however, it is easily interchangeable both in hardware and software with nearly all pulsed laser sources available. As will be discussed below, it is also possible to exchange the laser excitation source with high repetition-rate femtosecond Ti:Sapphire with or without a laser-pumped optical parametric amplifiers if applicable, which are significantly more expensive. The 1-100 kHz tunable laser excitation source enables high repetition-rate measurements with optional excitation wavelengths of 1064 nm, 532 nm, 355 nm, and 266 nm and average powers up to 15 W. Before encountering the sample, the laser beam is chopped using a mechanical chopper 20 that is synchronized to the laser pulse. It is also possible to modulate the intensity of the laser pulse using other means such as an acousto-optical or electro-optical modulator. A mirror 2 is used for steering the beam onto the sample position 3, ensuring overlap with the mid-infrared probe (or monitoring) beam. Finally, other sample excitation sources including mechanical, electrical, chemical, or thermal sources can be used.

Figure 2:
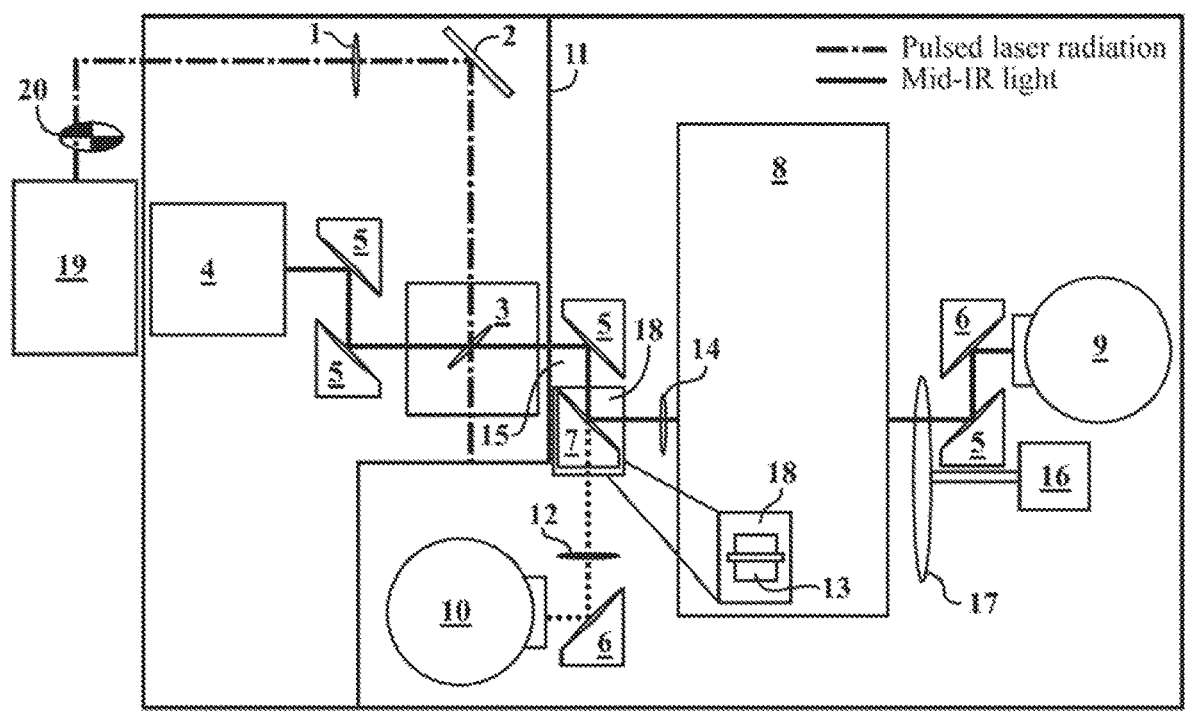
FIG. 2 is a schematic of a time-resolved transient absorption spectrometer according to an embodiment of the present invention.

In the example illustrated in FIG. 2, the second optical beam path for the probe beam uses a mid-infrared $MoSi_2$ source as the probe (or monitoring) beam. The mid-IR light source (globar) is powered using a variable 0-100 V DC power supply that can be computer-controllable. The output of the globar is collected and collimated by a 4-inch effective focal length, gold-coated, off-axis parabolic reflector 5. The resulting beam is then focused using an identical reflector 5 onto the sample 3. The mid-IR globar light source can be replaced by ultraviolet, visible, near-IR, or alternate mid-IR light sources such as laser-driven light sources, Xe arc lamps, tungsten halogen lamps, or lasers.

The sample can consist of a variety of types of samples, including liquids or films, depending on the experimental demands. Liquid samples may be flowed during experiments in temperature-controllable demountable liquid flow cells pumped by peristaltic pumps (all commercially available components). Film samples may be optionally measured inside of temperature-controllable cryogenic chambers under vacuum, or in some cases under chemical vapor atmosphere, including air, nitrogen, argon, and oxygen. A shutter 15 (which can be manually operated or automatically operated using a computer) is placed immediately after the sample in order to control when the beam is allowed to impinge on the detectors (discussed below). After transmitting the sample, the mid-infrared beam is recollected and collimated by another off-axis parabolic reflector 5. The light is then focused onto the slits of a monochromator 8, which is a ¼ meter, triple-grating monochromator. Other monochromators or wavelength selecting instruments can be used with different pathlengths and focusing elements. A variety of gratings are available, including those optimal for diffracting ultraviolet, visible, near-infrared and mid-infrared light spanning 0.2-20 µm. In order to further remove laser scatter and visible/near-infrared photoluminescence from entering the monochromator and potentially reaching the detector, a longpass optical filter 14 is placed immediately before the entrance slit. Upon exiting the monochromator 8, the beam is filtered using an assortment of optical longpass filters in order to remove overlapping higher orders of diffraction from the beam. The filters are kept in a motorized, computer-controlled filter wheel 17. The placement of the filters in the optical path can also be controlled manually. A 4-inch effective focal length, gold-coated, off-axis parabolic reflector 5 is used to collect and collimate the light exiting the monochromator, and a second parabolic 6 (with a 2 inch focal length) is used to focus the light (with ~2× minimization) onto a DC-coupled 16 MHz MCT photodiode detector 9. Other focusing elements with different focal lengths can be used that are either reflective or transmissive, such as lenses. Furthermore, the MCT detector can be replaced by other detectors suitable for the ultraviolet, visible or near-IR spectral ranges.

As an option, if it is desired to detect a wide spectral range instead of scanning specific wavelengths using the monochromator, the parabolic reflector 7 immediately preceding the monochromator may be easily removed to accommodate an alternate probe beam path. In place of this reflector, an optical filter holder 18 may be placed in the beam path for selecting the broadband wavelength range desired. These filters 13 may include mid-infrared longpass, shortpass, bandpass, or notch filters. Following the optical filter holder, the beam travels through an adjustable aperture (iris) 12, which is designed to limit the amount of light exposed to the detector, if necessary, to prevent saturation or even damage. Following the iris, the beam is focused using a 2 inch effective focal length, gold-coated, off-axis parabolic reflector 6 onto a DC-coupled 100 MHz MCT photodiode detector.

2. Data Acquisition

The data acquisition method will now be discussed.

All detected signals are digitized using a 200 MHz digital oscilloscope. The detection scheme employs a noise suppression scheme ("sequential subtraction"), which is extensively detailed in Rimshaw et al., *Rev. Sci. Instr.*, 2015, 86, 066107, but is briefly described as follows: Taking advantage of fast trigger rearm times made possible through recent invention of rapid acquisition trigger modes, the digital oscilloscope is able to record the sample signal (as a detector photovoltage) associated with each individual laser excitation pulse sequentially in time for repetition rates up to 1000 kHz. The change in transmission ($\Delta T$) of the detected mid-infrared beam (signal with excitation pulse present versus signal in absence of laser pulse) is determined on a laser shot-by-shot basis in order to effectively subtract any non-white noise from the detected photovoltage. The voltage is recorded by the oscilloscope set to AC-coupling mode in order to maximize the voltage resolution. This is performed for a user-designated number of laser shots. Following the acquisition of the change in transmission as a result of the excitation pulse, the oscilloscope is switched to DC-coupled mode in order to record the steady-state transmission (T) of the mid-infrared beam (in the absence of the excitation pulse). The transient absorption signal is then calculated using $\Delta T/T$. The collection of $\Delta T$ and T signals back-to-back improves S/N by eliminating noise associated with low-frequency drifts in the probe beam intensity. The digital resolution of the oscilloscope can be chosen to be 8-, 12-, or 14-bit depending on the needs of the experiment. After averaging the transient absorption signal for a chosen number of laser shots, the monochromator grating is rotated and this process is repeated for the next desired wavelength. A full nanosecond-to-millisecond time-resolved mid-infrared spectrum is generated by stacking the time-resolved signal for each light wavelength detected.

3. Expansions and Modifications to the Instrumentation

The instrument and noise suppression mechanisms described above are highly modular and can be expanded to include operation in not only the mid-infrared, but also the ultraviolet, visible, and near-infrared spectral ranges. This is made possible by installing alternate light sources, monochromator gratings, and photodetectors that are efficient in the desired spectral regions. The instrument may additionally be modified to incorporate a variety of samples, including liquids and films. It is possible to incorporate temperature-controlled, atmosphere-controlled cryostat systems, in addition to temperature-controlled liquid flow cells. Depending on the specific experiment, the mid-infrared globar source may be replaced with higher-intensity continuous wave lasers, such as quantum-cascade lasers, for sample systems that transmit mid-infrared light poorly, such as aqueous solutions. In all cases, the optical layout and detection system is essentially identical.

Importantly, the instrument can easily be configured to accommodate femtosecond excitation sources, including optical parametrically amplified Ti:Sapphire and Yb:CALGO lasers, which are commonplace in ultrafast optical spectroscopy laboratories. These are high-repetition rate, tunable laser systems that provide excitation pulses that are also ideal for nanosecond-to-microsecond time-resolved mid-infrared spectroscopy. Because of its relatively small footprint, this technology may be easily incorporated into already-constructed ultrafast laser facilities.

Instrument Performance

Figure 3:
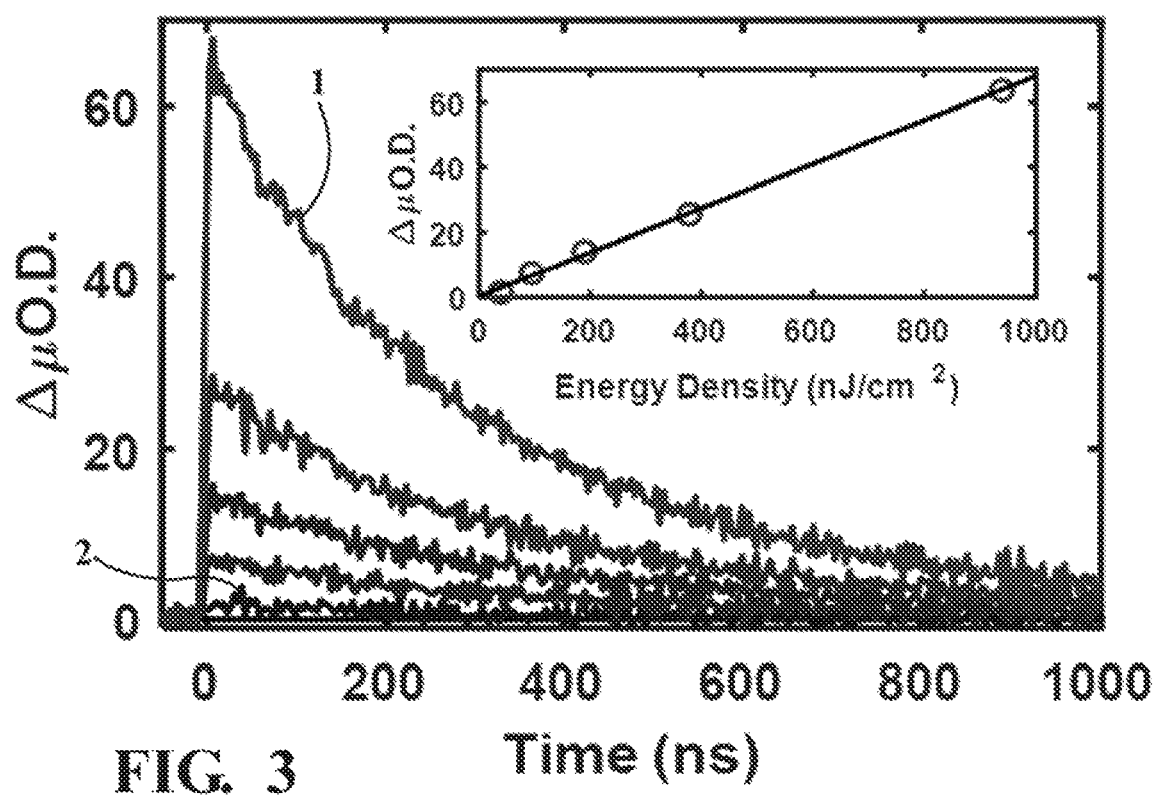
FIG. 3 is a plot showing excitation energy dependent mid-IR transient absorption measurements with different excitation energy density.
Figure 4:
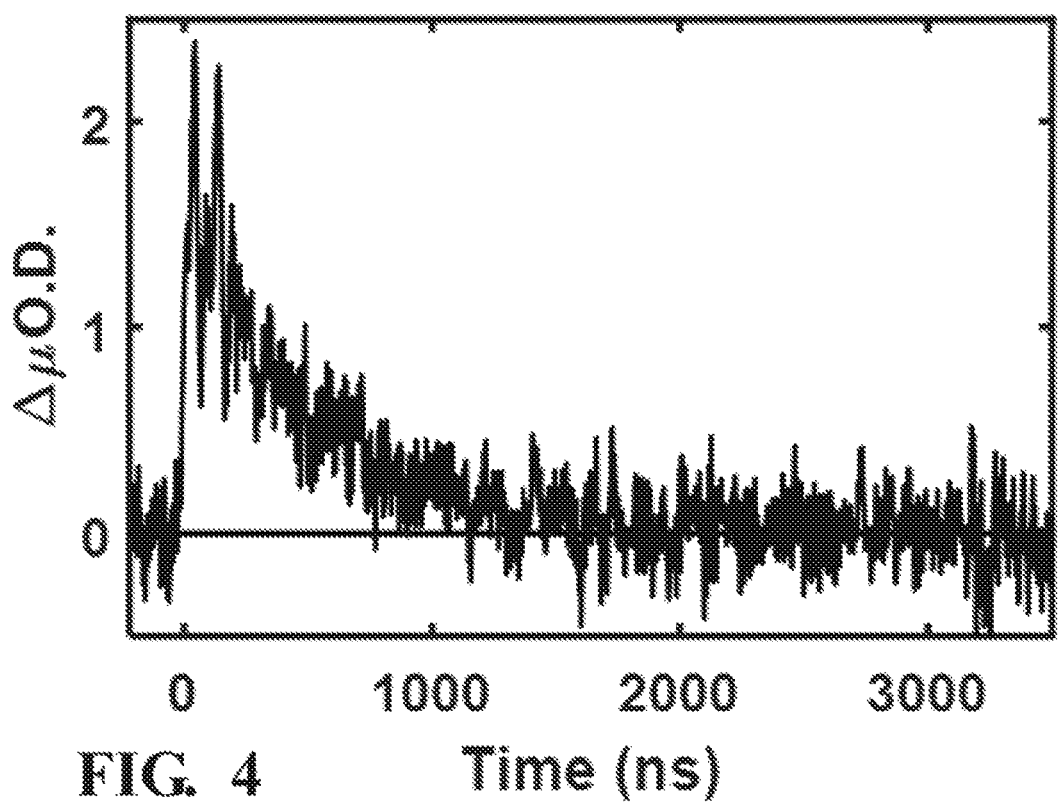
FIG. 4 is a curve corresponding to the lowest curve in FIG. 3 with a 25 nJ/cm$^2$ absorbed energy density.

In order to quantify the improvements in sensitivity of the technology, the standard detection limit (SDL) in change of optical density ($\Delta$O.D.) units was determined. The previous most sensitive instrument reported to date had a SDL of $10^{-5}$ $\Delta$O.D. (see Rimshaw et al. *Appl. Spec.* 2016. 70, 1726-1732 for details). SDL is calculated using the following equation;

$$SDL = y_{blank} + 3s$$

Where $y_{blank}$ is the signal intensity with no sample present and s is the standard deviation of the noise floor. The transient absorption signal intensity of a PbS quantum dot film was measured as a function of pump laser fluence due to the readily measured excited state absorption present in the mid-IR for the QD sample. The transient absorption decays are shown in FIG. 3 for various absorbed energy densities. FIG. 3 shows excitation energy dependent mid-IR transient absorption measurements for a 3.2 nm diameter PbS quantum dot film capped with oleic acid. The lowest energy measured was 25 nJ/cm$^2$ and the highest energy measured was 1000 nJ/cm$^2$. The lowest curve 2 in FIG. 3 corresponding to 25 nJ/cm$^2$ excitation energy density yielded a resolvable 1.5 $\Delta\mu$O.D. signal, as shown in FIG. 4. A measured signal of this magnitude is itself one order of magnitude lower than any comparable instruments to date. As the pump fluence is lowered, smaller and smaller induced absorption signals are measured. All of the measured data was limited to a maximum of one hour of total scan time in order to represent a signal that can be readily collected without significant effort and time investment. The technology of the present invention allows the instrument to have a SDL of $10^{-7}$ $\Delta$O.D. This is two orders of magnitude lower than the best available instrumentation to date.

Additionally, the absorbed energy density, to the best of the inventor's knowledge, is the lowest reported energy density used to clearly resolve a transient absorption signal for any instrument on any timescale for similar sample types. Such high sensitivity is only made possible through the culmination of the three noise suppression strategies discussed herein above and cannot be explained through additive noise cancellation effects.

Figure 5:
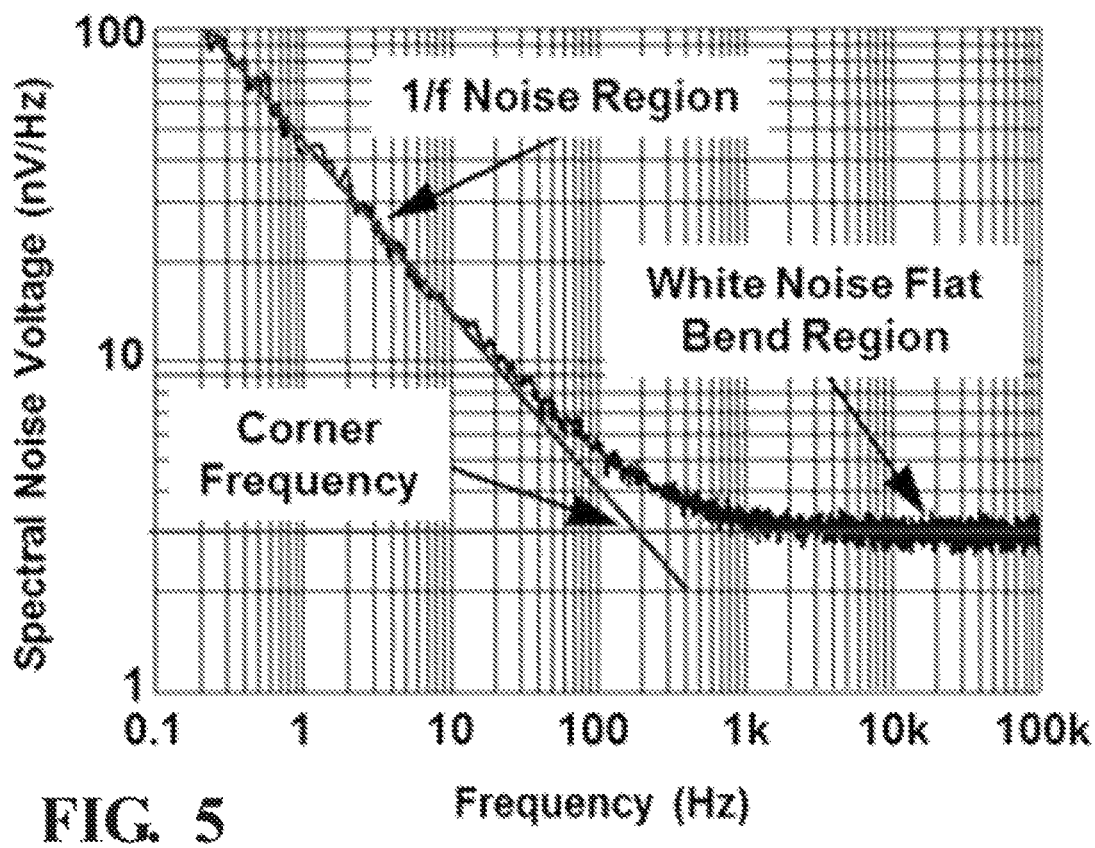
FIG. 5 is a spectral noise plot as a function of collection frequency.

FIG. 5 is a plot showing how spectral noise scales with frequency as a function of collection frequency. In the present invention, the high repetition rate refers to frequencies of 0.1 kHz and higher and the laser operates at 1 kHz to 100 kHz. Straight lines are a reference to demonstrate 1/f and white noise features, which are reproduced from www.smart2zero.com.

Figure 6:
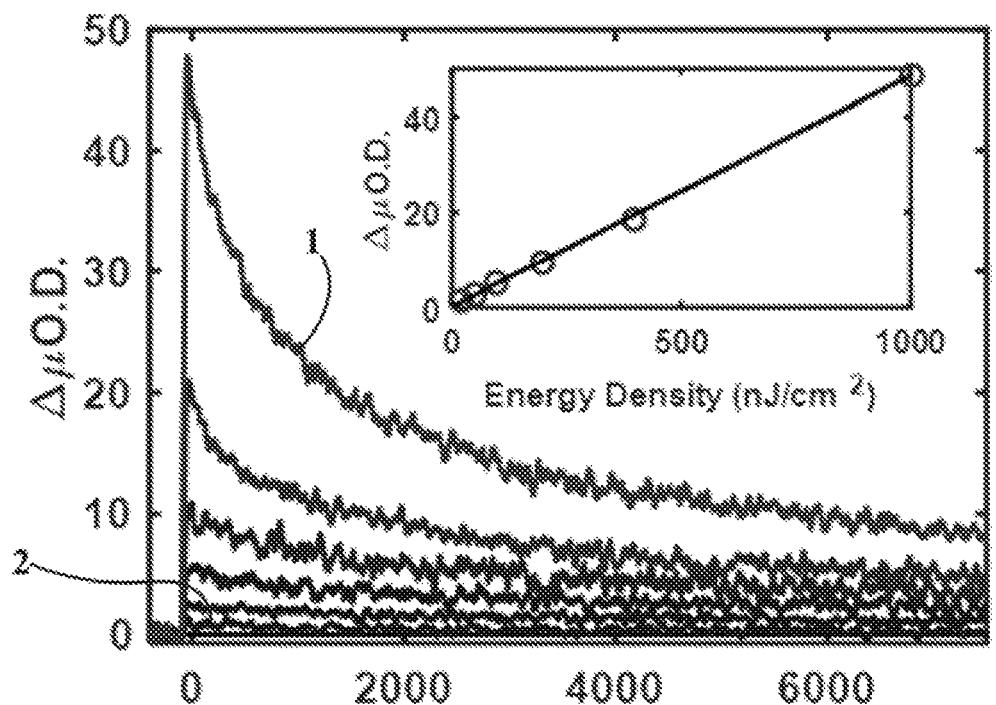
FIG. 6 is a plot showing excitation energy dependent near-IR transient absorption measurements with different excitation energy density.
Figure 7:
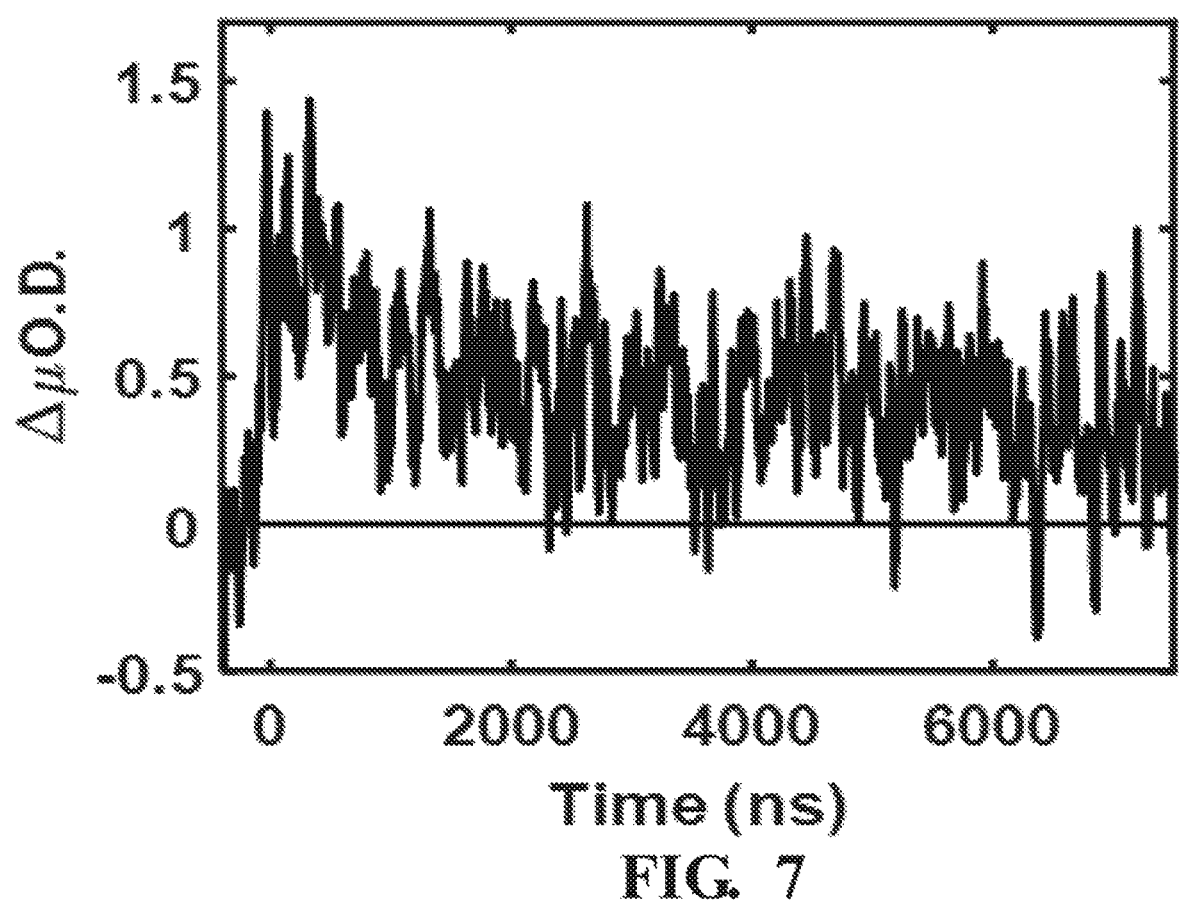
FIG. 7 is a curve corresponding to the lowest curve in FIG. 6 with a 20 nJ/cm$^2$ absorbed energy density.

FIG. 6 demonstrates the measurement for the standard detection limit SDL of the near-IR instrument for a poly(3-hexylthiophene-2,5-diyl) and phenyl-C61-butyric acid methyl ester (P3HT:PCBM) blend film. The near-IR detection limit, when combining all three noise suppression techniques outlined in the technology disclosure, is 100 $\Delta$nO.D. which is a significant improvement over existing technologies and a 100 fold increase in sensitivity when compared to the combination of any two noise suppression strategies. The lowest energy measured was 20 nJ/cm$^2$ and the highest energy measured was 1000 nJ/cm$^2$. The lowest curve 2 in the plot corresponding to 20 nJ/cm$^2$ excitation energy density yielded a resolvable 1 $\Delta\mu$O.D. signal, as shown in FIG. 7.

Figure 8A:
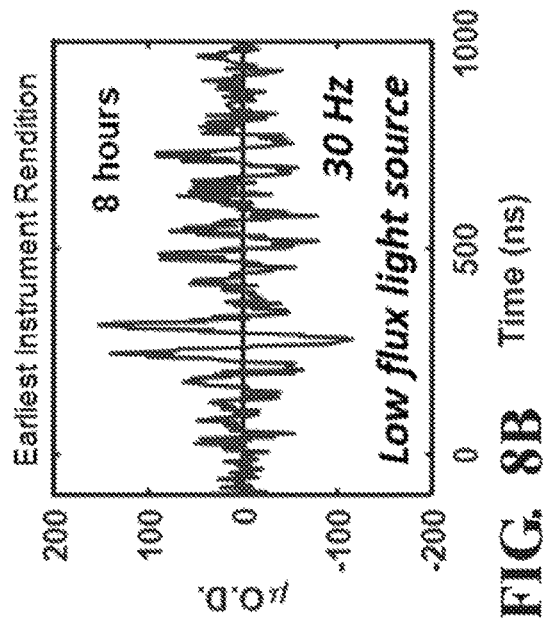
FIG. 8A is a plot showing sample measurements conducted for: a) low repetition-rate excitation, no sequential subtraction noise suppression, no sequential switching between AC- and DC-coupled detection scheme with a DC-coupled detector, and a high flux mid-IR light source.

In order to demonstrate the improvements this technology provides over state of the art instruments developed, measurements were performed on the same sample, under conditions which replicated the various instruments reported previously. Other than altering the system to replicate a particular instrument, all of the measurements conducted were performed under identical conditions. All measured data are displayed in FIGS. 8A-8D. The pump laser fluence was held constant (650 nJ/cm$^2$), along with the number of laser shots used to measure the signals (615,000). The sample used for these measurements was a PbS QD dot film which gives a strong transient absorption in the mid-IR spectral region. FIG. 8A shows the measurement conducted in the absence of a high repetition rate laser excitation source along with eliminating sequential subtraction noise suppression and sequential switching between an AC- and DC-coupled detection scheme. It is clear from this figure that no transient absorption signal is resolvable within the 8 hour scan time required to collect all 615,000 laser shots. This is largely due to the weighty ringing noise observed in the data. Without sequential subtraction this ringing noise cannot be eliminated. Additionally, because the data collection frequency is low, there is significant 1/f noise present which further obscures any signal if present. Such an instrument has an SDL$\gg 10^{-5}$ $\Delta$O.D.

Figure 8B:
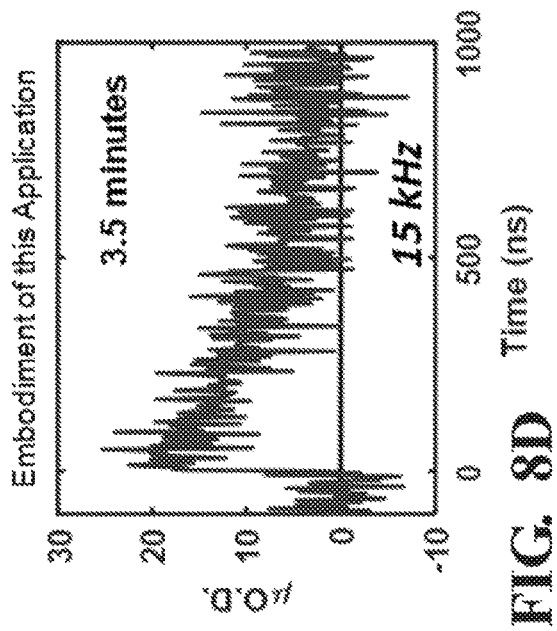
FIG. 8B is a plot showing sample measurements conducted under identical conditions as FIG. 8A except with low repetition-rate excitation, with sequential subtraction noise suppression, low flux mid-IR light source, and sequential switching between AC- and DC-coupled detection scheme with a DC-coupled detector.

FIG. 8B displays representative data for an instrument built previously and published due to its significant S/N enhancement (Rimshaw et al. *Appl. Spec.* 2016. 70, 1726-1732). With this instrument, a low repetition rate laser was used as the excitation source and a smaller mid-IR light source with lower photon flux was used. This instrument did implement the sequential subtraction technique developed prior to the publication (Rimshaw et al. *Appl. Spec.* 2016. 70, 1726) along with sequential switching between AC- and DC-coupling detection schemes. The data reveal that this variant of the instrument reduced the ringing noise by more than one order of magnitude. A large suppression of noise may be associated with the sequential subtraction technique. Even though the noise was significantly reduced with this version of the instrument, the signal that is to be measured is too small to be resolved after 8 hours. The main issue with this rendition is the low probe light levels on the detector and the presence of 1/f noise due to low frequency data collection that obfuscates any signal.

Figure 8C:
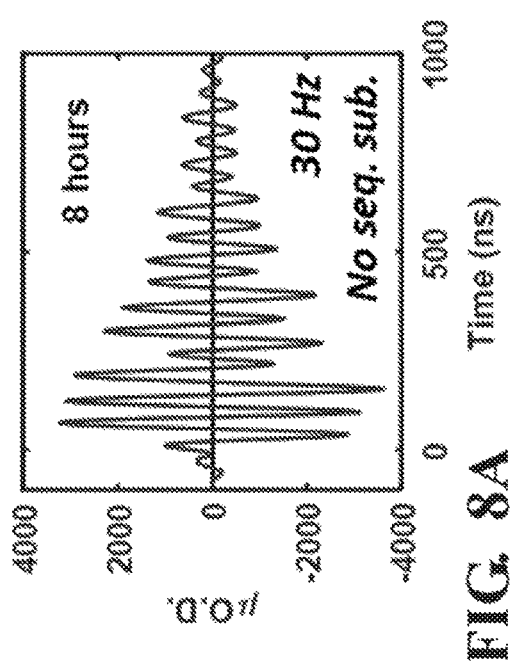
FIG. 8C is a plot showing sample measurements conducted under identical conditions except with low repetition-rate excitation, with sequential subtraction noise suppression, high flux mid-IR light source, and sequential switching between AC- and DC-coupled detection scheme with a DC-coupled detector.

Changing the mid-IR light source to one of high photon flux while continuing to use the sequential subtraction technique, sequential switching between AC- and DC-coupled detection schemes using a DC-coupled detector, and a low frequency excitation source yielded the results shown in FIG. 8C. In this figure there is still substantial 1/f noise present after an 8 hour scan and 615,000 laser shots; however there is also a signal that is somewhat resolvable. Although there is clearly a signal in this data, it is obscured by 1/f noise which is unable to be subtracted after 615,000 scans and results in a SDL for this type of instrument of $10^{-5}$ ΔO.D. The instrument capable of collecting this sort of data is the subject of U.S. Provisional patent Application No. 62/510,377.

Figure 8D:
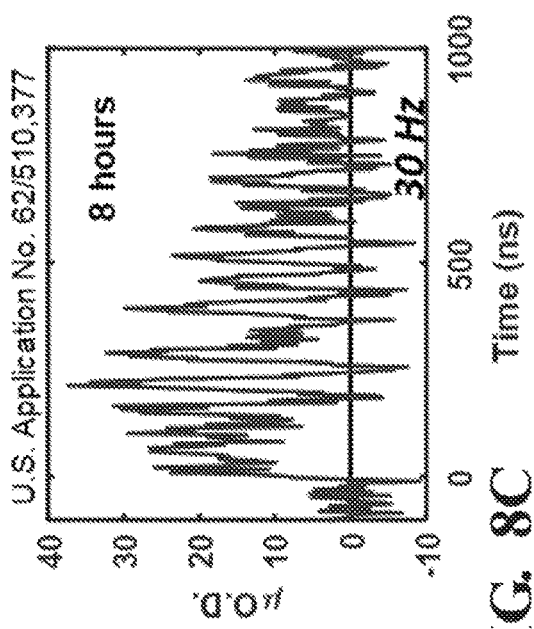
FIG. 8D is a plot showing sample measurements conducted under identical conditions except with high repetition-rate excitation, with sequential subtraction noise suppression, high flux mid-IR light source, and sequential switching between AC- and DC-coupled detection scheme with a DC-coupled detector.

The plot in FIG. 8D represents data collected with the technology that is in accordance with the present invention. This instrument incorporates all three noise cancellation components outlined herein above to provide the highest sensitivity mid-IR time-resolved transient absorption spectrometer reported to date. FIG. 8D demonstrates the increase in sensitivity of the present instrument that is largely enabled by the reduction of noise. A signal is clearly visible in the data, and the ringing noise from low frequency measurements is completely eliminated. In addition to the increased sensitivity, because the data was collected at a higher frequency (7.5 kHz for this measurement) the 615,000 laser shots needed for the direct comparison of this data to the other three measurements was collected in only 3.5 minutes. This is in stark contrast to the 8 hours required to collect the significantly worse data in FIGS. 8A-8C at a lower frequency (15 Hz). In its entirety, FIGS. 8A-8D clearly demonstrates the unexpected result of incorporating all three advances: 1) sequential subtraction, enabled through rapid rearm time digitizers, 2) high flux, mid-IR light sources with sequential switching between AC- and DC-coupled detection schemes using a DC-coupled detector, and 3) high frequency data collection for a drastic increase in sensitivity for transient absorption instrumentation. FIGS. 9A-9D represent the measured data that is the same as shown FIGS. 8A-8D but at the same vertical scale to facilitate their quantitative comparison.

Figure 10A:
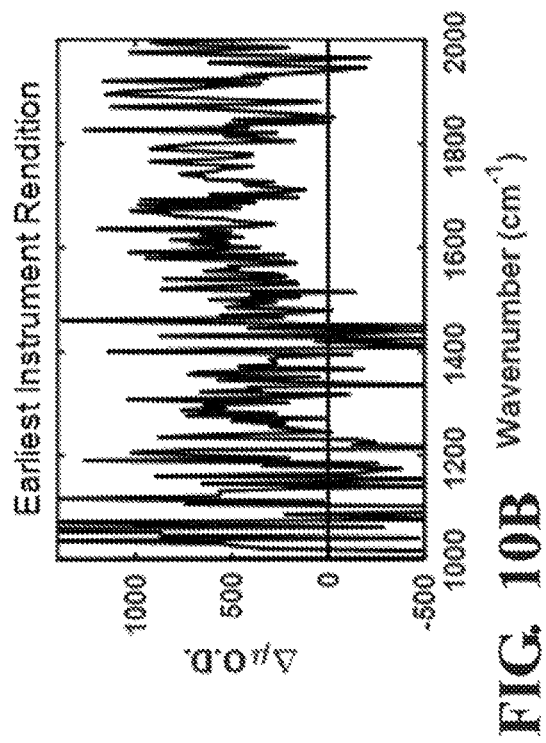
FIG. 10A is a plot showing sample measurements conducted for: a) low repetition-rate excitation, no sequential subtraction noise suppression, no sequential switching between AC- and DC-coupled detection scheme with a DC-coupled detector, and high flux mid-IR light source.
Figure 10B:
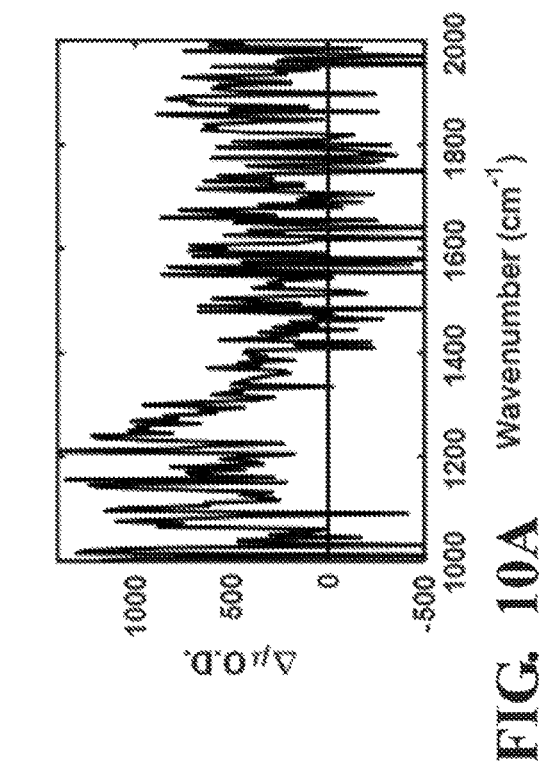
FIG. 10B is a plot showing sample measurements conducted under identical conditions as FIG. 10A except with low repetition-rate excitation, with sequential subtraction noise suppression, low flux mid-IR light source, and sequential switching between AC- and DC-coupled detection scheme with a DC-coupled detector.
Figure 10C:
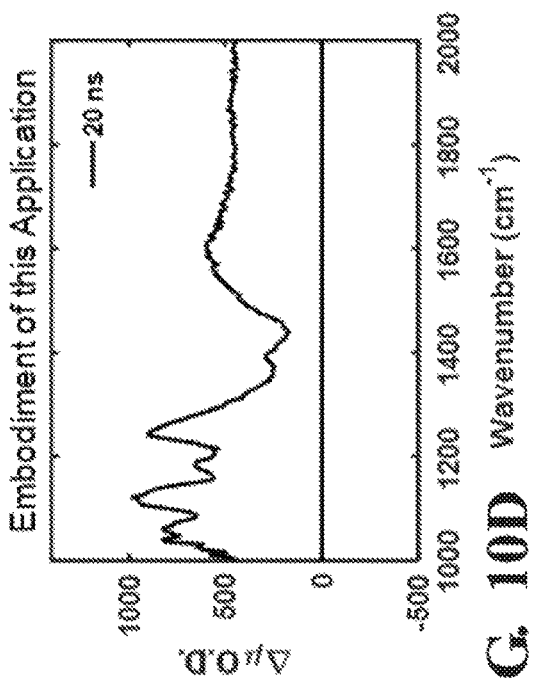
FIG. 10C is a plot showing sample measurements conducted under identical conditions except low repetition-rate excitation, with sequential subtraction noise suppression, high flux mid-IR light source, and sequential switching between AC- and DC-coupled detection scheme with a DC-coupled detector.
Figure 10D:
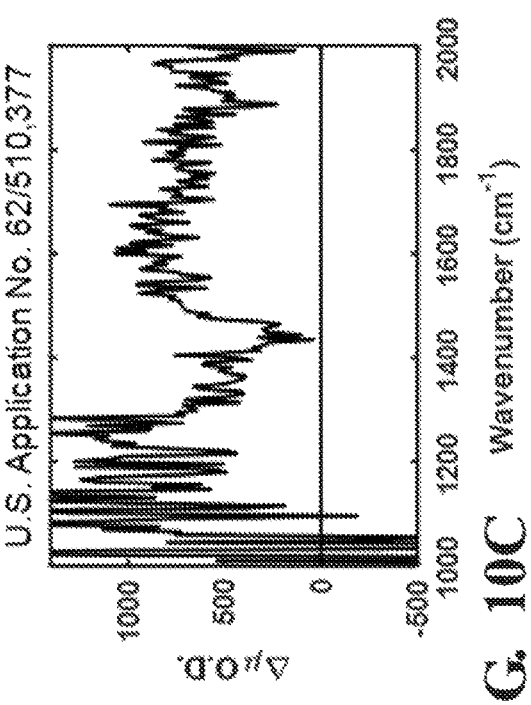
FIG. 10D is a plot showing sample measurements conducted under identical conditions except with high repetition-rate excitation, with sequential subtraction noise suppression, high flux mid-IR light source, and sequential switching between AC- and DC-coupled detection scheme with a DC-coupled detector.

Since the instrument is capable of measuring spectra along with time-dependent kinetics, time-resolved spectra for the various iterations of the instrument were collected, in a similar way as in FIGS. 8A-8D, to demonstrate the scope of improvements for this type of data. To do this, a blend film of (P3HT:PCBM) was chosen due to its distinct vibrational character in its mid-IR transient absorption spectrum. Spectra were collected for 30 minutes each and plotted at various time points to contrast the type of data that can be collected with the new system in the same amount of time as the other iterations of the instrument. These measurements are presented in FIGS. 10A-10D and display the capabilities of the various instruments. Going from FIG. 10A to FIG. 10D there is a clear progression in the resolution of the signals. FIG. 10D however, embodies the significant jump in instrument capabilities from the other iterations and stands out as being orders of magnitude better than even the instrument which was the subject of U.S. Provisional patent Application No. 62/510,377. This remarkable improvement was only made possible through the meticulous combination of all three noise cancellation mechanisms, as discussed herein.

Figure 11B:
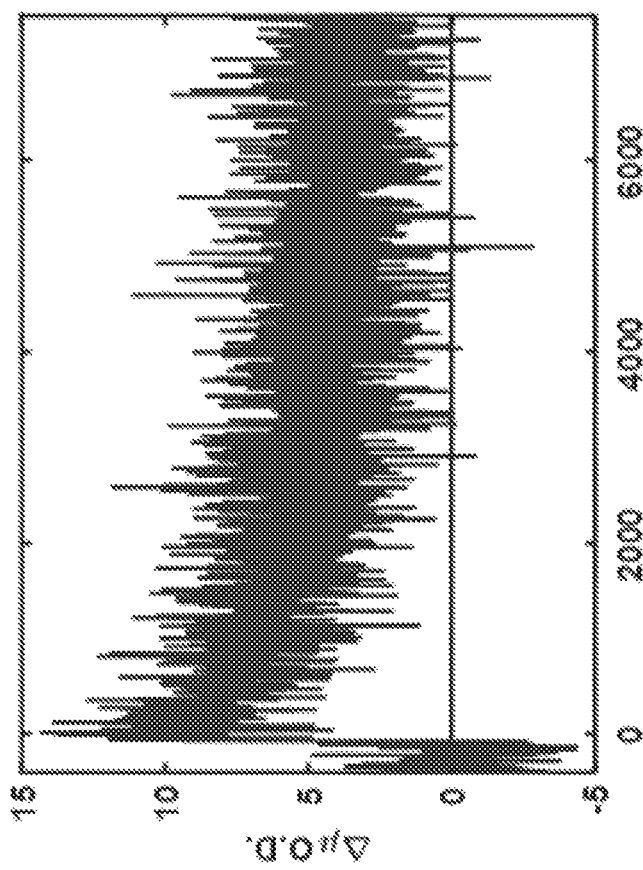
FIG. 11B is a plot showing transient absorption kinetics of a P3HT:PCBM sample measured at 15 kHz at a probe wavelength of 1000 nm on the near-IR/visible instrument.
Figure 11A:
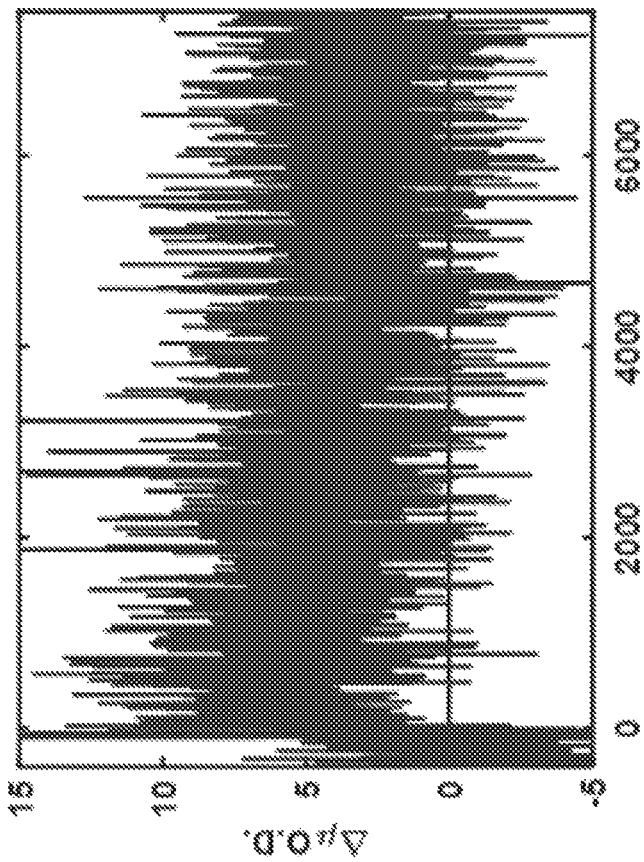
FIG. 11A is a plot showing transient absorption kinetics of a P3HT:PCBM sample measured at 30 Hz at a probe wavelength of 1000 nm on the near-IR/visible instrument.

FIGS. 11A-11B show a comparison of a signal measured with our previous state-of-the-art near-IR instrument and one measured with the technology of the present invention in near-IR region, combining sequential subtraction/rapid rearm digitizers, high flux near-IR light sources, sequential switching between AC- and DC-coupled detection schemes enabled by the use of DC-coupled detectors, and the high frequency laser. Absorption kinetics of a P3HT:PCBM sample measured at 30 Hz (FIG. 11A) and 15 kHz (FIG. 11B) at a probe wavelength of 1000 nm on the near-IR/visible instrument. Both plots are an average of 350,000 laser shots. A signal is clearly visible in the data shown in FIG. 11B. In addition to the increased sensitivity, because the data in FIG. 11B was collected at a higher frequency, the 350,000 laser shots were collected in only 1.5 minutes.

Figure 12B:
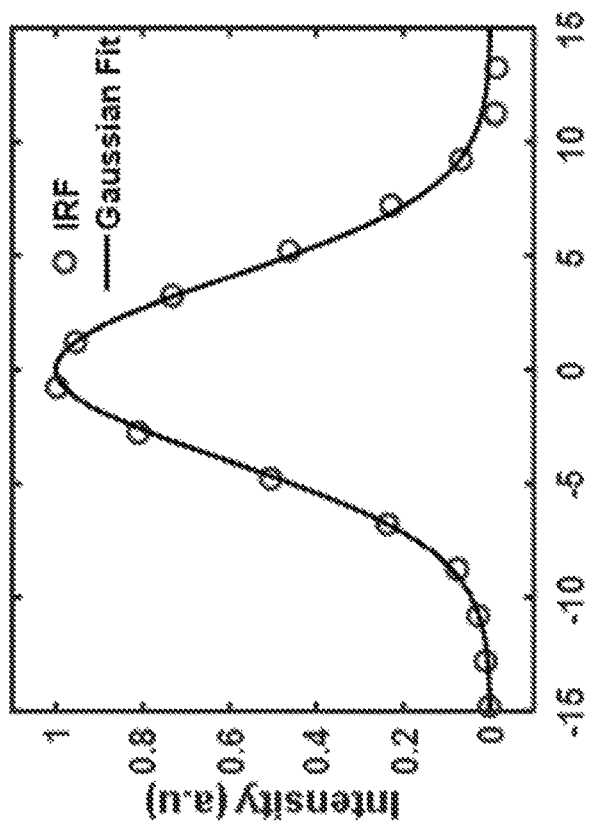
FIG. 12B is a plot showing a measured mid-IR instrument response function with the corresponding Gaussian fit function and full width at half maximum value for transient absorption instrument with a high frequency short pulse width laser.
Figure 12A:
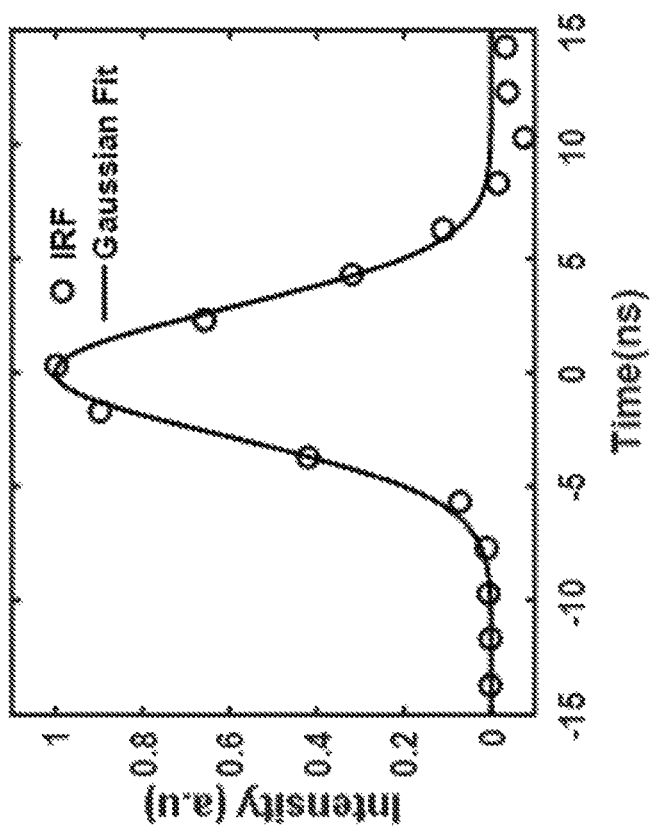
FIG. 12A is a plot showing a measured mid-IR instrument response function with the corresponding Gaussian fit function and full width at half maximum value for or transient absorption instrument with a low frequency laser.

As an additional benefit of changing the excitation source to the high repetition rate short pulsewidth laser, the instrument response time of the present system is also shortened. The instrument response time is the period required for the instrument detection apparatus to change from its original state to a final settled value. The response function determines the shortest lived signals the instrument is capable of resolving, and therefore faster instrument response times are sought in order to measure fast chemical and physical processes and expand instrument applications. The instrument response function for the low repetition rate laser is shown in FIG. 12A (9.4 ns) while the instrument response function for the new high frequency laser is demonstrated in FIG. 12B (6.6 ns). The instrument response function is reduced for the high frequency laser due to the shorter ~2.5 ns pulse duration of the laser as opposed to the ~10 ns pulse width of the low frequency laser used previously. With the high repetition rate laser, the instrument response function is limited by the bandwidth of the detector. The detector that has been incorporated in this system has the highest bandwidth of any MCT detector currently available. With the advent of new MCT detector technology faster detectors may become available which will further reduce the instrument response time capabilities of the instrument and further enhance applications.

Due to the maturity of the technology utilized in ultraviolet, visible, and near-IR detectors, the instrument response time is limited to the laser pulse width for measurements in these spectral ranges and is thus 2.5 ns with the current laser utilized. Instrument response times can be decreased to ~1 ns with the incorporation of an ultrafast Ti:Sapphire or Yb:CALGO laser with the system.

As will be clear to those of skill in the art, the embodiments of the present invention illustrated and discussed herein may be altered in various ways without departing from the scope or teaching of the present invention. Also, elements and aspects of one embodiment may be combined with elements and aspects of another embodiment. It is the following claims, including all equivalents, which define the scope of the invention.

The invention claimed is:

1. A high-sensitivity nanosecond to millisecond transient absorption spectrometer for measurements of miniscule signals under low excitation intensities, comprising:
   an excitation source generating an excitation pulse for exciting a light absorbing sample;
   a probe light source generating a probe light beam for measuring a transient absorption spectrum of the sample by monitoring transmission signals of the probe light beam before and after excitation by the excitation pulses;
   a detector for detecting the transmission signals and a change in the transmission signals of the probe light beam; and
   a digital oscilloscope for collecting the detected signals;
   wherein at least three of the following noise cancellation techniques are true:

the excitation pulse has a frequency greater than 100 Hz and a pulsewidth less than 5 ns;

the probe light beam has a photon flux producing an average irradiance greater than 1 µW m$^{-2}$ nm$^{-1}$ the detector is a DC-coupled detector operable to measure light for enabling sequential switching of an AC- and DC-coupled detection scheme for synchronous measurement of both the transmission of the probe light beam in an absence of the excitation pulse and the change in transmission of the probe light beam between a signal with the excitation pulse present and a signal in absence of the excitation pulse; and the digital oscilloscope has a trigger rearm time capable of collecting every trigger event at high frequencies including 1 MHz, thereby enabling sequential noise subtraction protocols.

2. The high-sensitivity nanosecond-to-millisecond transient absorption spectrometer according to claim 1, wherein the excitation source is a physical, thermal, electrical, or chemical stimulus.

3. The high-sensitivity nanosecond transient absorption spectrometer according to claim 1, wherein at least three noise cancellation techniques include:

the probe light beam has a photon flux producing an average irradiance greater than 1 µW m$^{-2}$ nm$^{-1}$ the detector is a DC-coupled detector operable to measure light for enabling sequential switching of an AC- and DC-coupled detection scheme for synchronous measurement of both the transmission of the probe light beam in an absence of the excitation pulse and the change in transmission of the probe light beam between a signal with the excitation pulse present and a signal in the absence of the excitation pulse; and the digital oscilloscope has a trigger rearm time capable of collecting every trigger event at high frequencies including 1 MHz, thereby enabling sequential noise subtraction protocols.

4. The high-sensitivity nanosecond transient absorption spectrometer according to claim 1, wherein the at least three noise cancellation techniques include:

the excitation pulse has a frequency greater than 100 Hz and a pulsewidth less than 5 ns;

the probe light beam has a photon flux producing an average irradiance greater than 1 µW m$^{-2}$ nm$^{-1}$; and the detector is a DC-coupled detector operable to measure light for enabling sequential switching of an AC- and DC-coupled detection scheme for synchronous measurement of both the transmission of the probe light beam in an absence of the excitation pulse and the change in transmission of the probe light beam between a signal with the excitation pulse present and a signal in the absence of the excitation pulse.

5. The high-sensitivity nanosecond transient absorption spectrometer according to claim 1, wherein the at least three noise cancellation techniques include:

the excitation pulse has a frequency greater than 100 Hz and a pulsewidth less than 5 ns;

the probe light beam has a photon flux producing an average irradiance greater than 1 µW m$^{-2}$ nm$^{-1}$; and the digital oscilloscope has a trigger rearm time capable of collecting every trigger event at high frequencies including 1 MHz, thereby enabling sequential noise subtraction protocols.

6. The high-sensitivity nanosecond transient absorption spectrometer according to claim 1, wherein the at least three noise cancellation techniques include:

the excitation pulse has a frequency greater than 100 Hz and a pulsewidth less than 5 ns;

the detector is a DC-coupled detector capable of measuring light for enabling sequential switching of an AC- and DC-coupled detection scheme for synchronous measurement of both the transmission of the probe light beam in the absence of excitation and the change in transmission of the probe light beam between a signal with an excitation pulse present and a signal in absence of the excitation pulse; and the digital oscilloscope has rapid trigger rearm time capabilities and is fast enough to collect every trigger event at high frequencies up to 1 MHz, for enabling sequential noise subtraction protocols.

7. The high-sensitivity nanosecond transient absorption spectrometer according to claim 1, wherein the probe light beam is in the ultraviolet, visible, near-IR, and/or mid-IR spectral region(s).

8. The high-sensitivity nanosecond transient absorption spectrometer according to claim 1, wherein the detector is operable to measure light in the ultraviolet, visible, near-IR, and/or mid-IR spectral region(s).

9. The high-sensitivity nanosecond transient absorption spectrometer according to claim 1, wherein the sample is a liquid sample or a film.

10. The high-sensitivity nanosecond transient absorption spectrometer according to claim 1, further comprising an optical layout including parabolic reflectors.

11. A high-sensitivity nanosecond to millisecond transient absorption spectrometer for measurements of miniscule signals under low excitation intensities, comprising:

an excitation source generating a frequency greater than 100 Hz, pulsewidth less than 5 ns excitation pulse for exciting a light absorbing sample;

a probe light source for generating a photon flux probe light beam producing an average irradiance greater than 1 µW m$^{-2}$ nm$^{-1}$ for measuring the transient absorption spectrum of the sample by monitoring transmission signals of the probe light beam before and after excitation by the excitation source;

a DC-coupled detector operable to measure light for enabling synchronous measurement of both the transmission of the probe light beam in an absence of the excitation pulse and the change in transmission of the probe light beam between a signal with the excitation pulse present and a signal in the absence of the excitation pulse; and a digital oscilloscope with a trigger rearm time capable of collecting every trigger event at high frequencies including 1 MHz, for enabling sequential noise subtraction protocols.

12. The high-sensitivity nanosecond transient absorption spectrometer according to claim 11, wherein the probe light beam is in the ultraviolet, visible, near-IR, and/or mid-IR spectral region(s).

13. The high-sensitivity nanosecond transient absorption spectrometer according to claim 11, wherein the detector is operable to measure light in the ultraviolet, visible, near-IR, and/or mid-IR spectral region(s).

14. A method of measuring miniscule signals under low excitation intensities using a high-sensitivity nanosecond to millisecond transient absorption spectrometer, the method comprising:

exciting a light absorbing sample using excitation pulses each having a frequency greater than 100 Hz and a pulsewidth less than 5 ns;

after a delay of each excitation pulse, transmitting a probe light beam to the light absorbing sample, the probe light beam having a photon flux, producing an average irradiance greater than 1 $\mu W\ m^{-2}\ nm^{-1}$;

collecting the transmitted probe light beam signals using a detector, the detector being a DC-coupled detector operable to measure light for enabling sequential switching of an AC- and DC-coupled detection scheme;

recording a change in the transmission $\Delta T$ of the probe light beam between the collected signal with the excitation pulse present and the signal in an absence of the excitation signal using a digital oscilloscope;

recording a steady-state transmission T of the probe light beam in the absence of the excitation pulse using the digital oscilloscope; and generating a transient absorption spectrum by calculating transient absorption signals using $\Delta T/T$, wherein the digital oscilloscope having a trigger rearm time capable of collecting every trigger event at high frequencies including 1 MHz, thereby enabling sequential noise subtraction protocols.

15. The method of claim 14, the method further comprising directing the transmitted signals from the sample using an optical layout to the detector.

\* \* \* \* \*